(12) United States Patent
Macaluso

(10) Patent No.: US 7,468,685 B1
(45) Date of Patent: Dec. 23, 2008

(54) CLOCKLESS SERIALIZATION USING DELAY CIRCUITS

(75) Inventor: Steven M. Macaluso, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/841,237

(22) Filed: Aug. 20, 2007

(51) Int. Cl.
*H03M 9/00* (2006.01)
(52) U.S. Cl. ........................ 341/101; 327/408
(58) Field of Classification Search ................ 341/100, 341/101; 327/407–413
See application file for complete search history.

(56) References Cited

U.S. PATENT DOCUMENTS

| | | | | |
|---|---|---|---|---|
| 3,166,637 A | * | 1/1965 | Oleson | 341/101 |
| 5,107,264 A | * | 4/1992 | Novof | 341/101 |
| 5,170,160 A | * | 12/1992 | Cooperman et al. | 327/407 |
| 5,625,303 A | * | 4/1997 | Jamshidi | 327/408 |
| 5,995,028 A | * | 11/1999 | Tai | 341/100 |
| 6,031,473 A | * | 2/2000 | Kubinec | 341/100 |
| 6,417,790 B1 | | 7/2002 | Fiedler | |
| 6,614,371 B2 | | 9/2003 | Zhang | |
| 7,006,021 B1 | | 2/2006 | Lombard | |
| 7,079,055 B2 | | 7/2006 | Padaparambil | |
| 2002/0041198 A1 | * | 4/2002 | Parris et al. | 327/408 |
| 2004/0201411 A1 | * | 10/2004 | White | 327/407 |

* cited by examiner

*Primary Examiner*—Howard Williams
(74) *Attorney, Agent, or Firm*—Cesari and McKenna, LLP; Edwin H. Paul, Esq.

(57) ABSTRACT

A serializer is described that incorporates a register and a delay circuit for each serial bit. The serializer provides a timing signal that is generated and output simultaneously with the output of the data bit that ensures close timing alignment of the data bit and the timing signal. No clock is used. This allows the deserialzer/receiver to reliably receive the data bit. Each illustrative delay circuit is configured to trigger the next register/delay circuit to output the next sequential bit and its timing signal.

14 Claims, 2 Drawing Sheets

CLOCKLESS SERIALIZATION USING DELAY CIRCUITS

BACKGROUND OF THE INVENTION

1. Field of the Invention

The present invention relates to serialization of data, and, more particularly, to serialization with out using a clock.

2. Background Information

In many applications computer data is generated with the bits of a byte (herein byte refers to a group of two or more bits) available in parallel. The next bytes then follow in a time sequence. This may be referred to as bit parallel, byte serial. However, in many applications, a cable with parallel wires carrying the parallel bits is physically inconvenient, more susceptible to noise, and sending the bits in parallel may dissipate more power. In these applications the bits may be sent one at a time.

Known serializers use a clock synchronized to the data bits so a deserializer/receiver may reliably "clock in" (receive) the data bits. The clock must be reliable and is often generated by a PLL (phase locked loop). Other clocks circuit may be employed, for example, a ring of inverters may be arranged with positive feedback to oscillate. In each case these clocks require time to become usable. PLL's may take microseconds to "lock" and other clocks may take hundreds of nanoseconds to stabilize.

In the prior art, the data bits may be sent in bursts of one, two or a few bytes at a time with periodic times when nothing is being sent. In such an instance, if the clock is stopped to conserve power, the locking or stabilizing times must be repeated for each burst. Such prior art systems suffer time and/or power dissipation limitations.

One representative prior art example is found in U.S. Pat. No. 6,614,371 owned by Broadcom Corp, Irving Calif., USA. This patent discloses a two path data storage arrangement with select and delay logic for serializing data. The circuitry, however, uses a clock.

The present invention addresses the limitations found in the prior art by eliminating the clock. Therefore, the present invention incurs no time or power dissipation penalties while providing timing signals for reliable reception.

SUMMARY OF THE INVENTION

The present invention provides a serializer that outputs a time sequence of data bits simultaneously with corresponding timing signals that reliably identify the data bits for a deserializer/receiver. A strobe initiates the serialization and each bit and its corresponding timing signal are output at the same time. After the delay of a preceding bit, the output of next bit and its timing signal are output. This operation repeats until all the bits in the byte are serially output. The sequence repeats when the next byte is ready to be serially output. In an embodiment there is no start up time required, and when nothing is being output very little power is used.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1A:
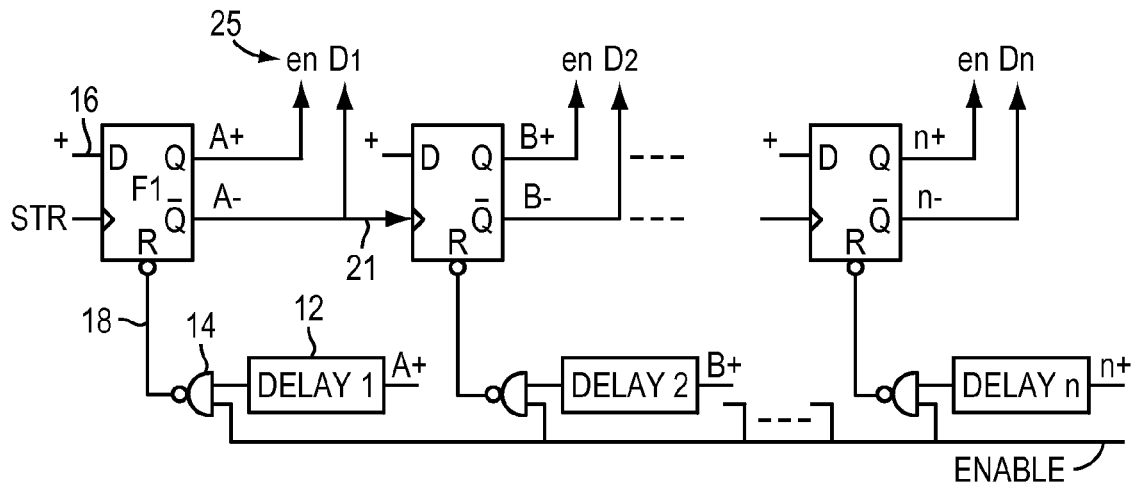
FIGS. 1A and 1B are partial schematic/timing diagrams of an embodiment of the present invention.

FIG. 1A illustrates sequential timing and control circuitry for a serializer illustrating the present invention. Consider that the registers F1, F2 to Fn are all reset and signals A, B to n are all low. A rising edge of a strobe signal, STR, sets of the D-type register, F1, since the D input tied to a positive logic level 16. Signal A+ goes high 10 and A− goes low. Signal A+ connects to the delay circuit 12 that provides a high going signal after the delay (DELAY 1) to an input of NAND gate 14. After the DELAY 1 time, the NAND output 18 goes low resetting F1. Signal A+ goes low 19 driving the reset signal 18 high allowing F1 to be set by a subsequent STR signal. The ENABLE signal is a control signal that is high during the serialization.

Figure 1B:
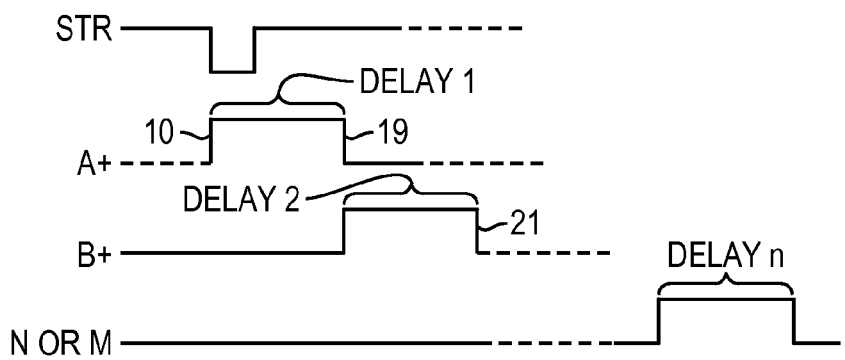

The combination of F1 and the feedback delay 12 that resets F1 is defined herein as an illustration of a "one shot." In the prior art there are many one shot circuits, and such circuits may be advantageously used by those skilled in the art in the context of the present invention. The one shots of FIG. 1 are illustrative.

The reset side of F1, A−, connects to the strobe input 21 of F2. The D input of F2 is high so the high going edge of A− (when F1 is reset) sets F2. The output B+ of F2 goes high and drives the DELAY 2 circuitry that, after the DELAY 2 time, resets F2 driving B+ low 21. The B− signal drives the gate of the next register (not shown) and the sequence continues through all ones shots in the chain. In this embodiment, the last register is Fn. Fn is set by the previous register's rising reset output, and then reset after the delay, DELAY n. The timing chart illustrates the sequence of each register being set in sequence for the duration of the delays. When Fn is reset, all the bits have been serialized and transferred with corresponding timing signals as described in more detail below.

Figure 2:
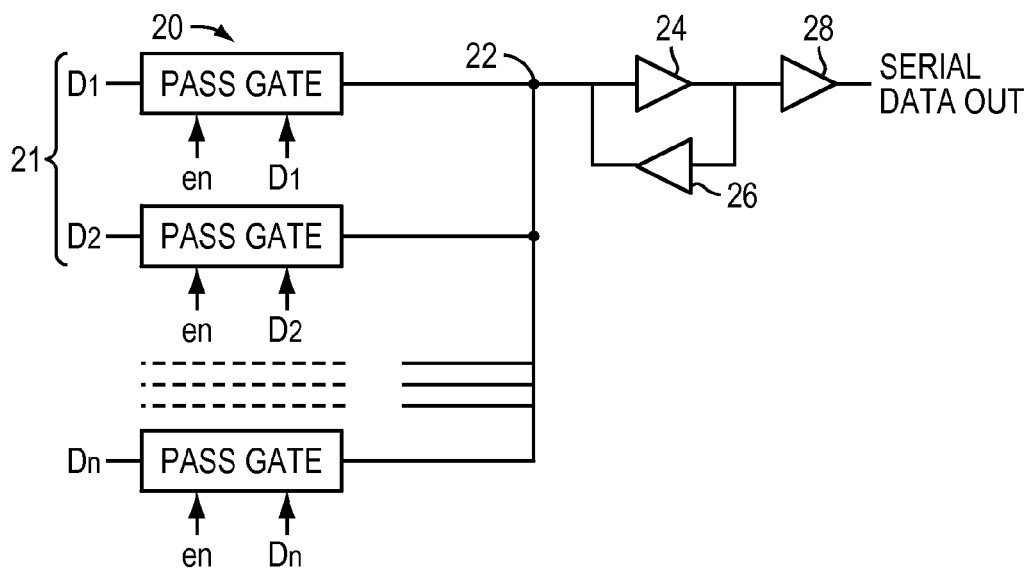
FIGS. 2 and 3 are partial schematics of an embodiment of the present invention.
Figure 3:
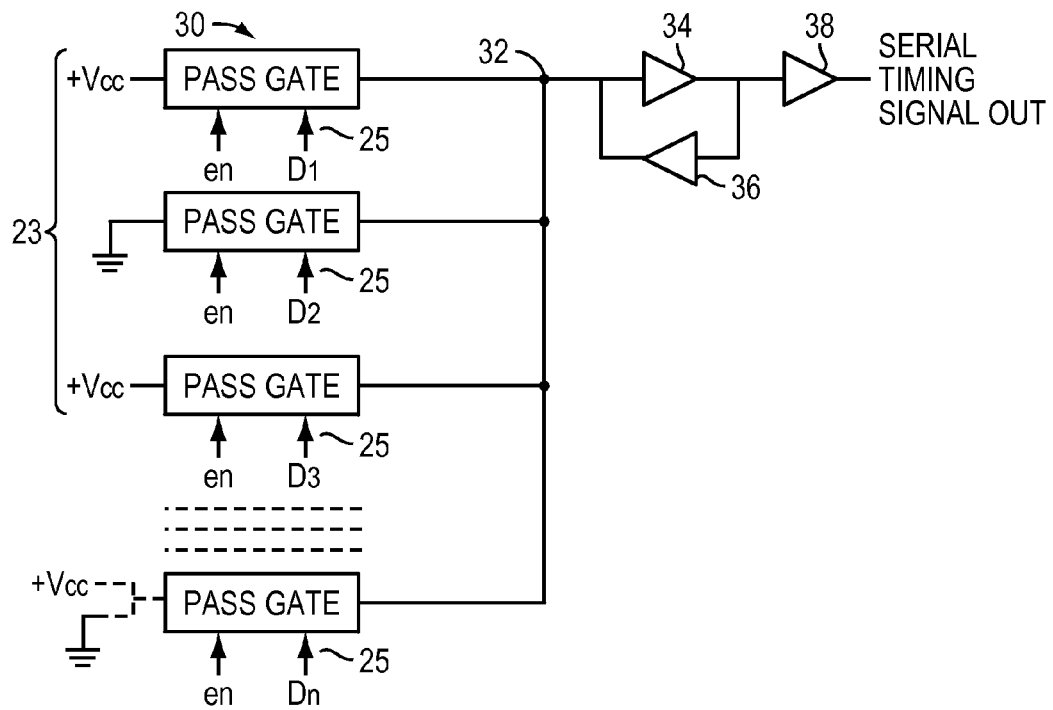

The register outputs, of FIG. 1A, are shown illustratively forming enable signals, enD1-enDn 25. These enable signals are illustrated in FIGS. 2 and 3 as enabling pass gates 20 and 30 (FIGS. 2 and 3) to output the data bits 21 in sequence with timing signals 23. The sequential operation of the enD1-enDn signals serially places the data bits D1-Dn, in order, onto location 22 while simultaneously creating a timing signal at location 32 (FIG. 3). The timing signals travel with the data bits and may be used by the deserializer/receiver to reliable receive the data bits.

The cross coupled inverters 24, 26 and 34, 36 form latches to hold the data bits and the timing signal, respectively, as they arrive. The latches 26 and 36 are designed so that data signals on location 22 and the timing signals at 32 overcome the drive of inverters 26 and 36. Inverters 28 and 38 drive, for example, a cable connected to a deserializer receiver.

FIG. 3 circuitry is illustratively identical to that of FIG. 2. However, in FIG. 3, the inputs to the pass gates 30 are logic highs and lows in an alternating sequence. The pass gates are enabled by the same enD signals used for the data bit pass gates of FIG. 2. The alternating highs and lows produces at location 32 a square wave with edges that occur at virtually the same time as the data bits are place on location 22 of FIG. 2.

Figure 4:
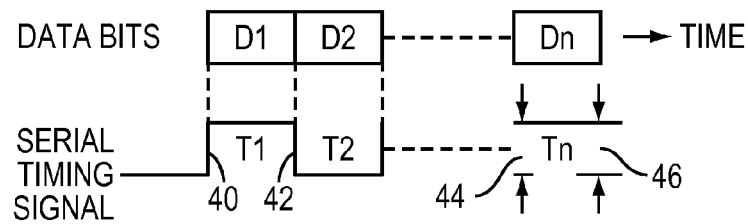
FIG. 4 is a timing diagram illustrating data and the corresponding timing signal.

FIG. 4 is an illustrative timing sequence showing the data bits, D1-Dn, and the timing signals T1-Tn. The leading edge 40 of the timing signal T1 is placed on the SERIAL TIMING SIGNAL OUT line simultaneously as D1 is placed on the SERIAL DATA OUT line. Similarly, the leading edge 42 of T2 and bit D2 occur simultaneously as do the leading edge 44 of Tn and Dn.

In the timing diagram of FIG. 4, considered with the circuitry of FIG. 1, care must be given to the last bit transferred. The SERIAL DATA (FIG. 2) may be left as a logic high or low since the deserializer/receiver will, in this illustrative design, wait for a rising timing signal edge to indicate the first bit of another byte. However, the state of the SERIAL TIMING SIGNAL OUT must be left at a low level. If the number of bits is even, the timing signal will naturally be left at a low, but if the number of bits is odd, the last timing signal edge will be from low to high, and the latch 34, 36 will maintain it high. It must be returned to a low in order to be ready for the first bit of the next byte. In this case an external signal (not shown) may be used to drive location 32 low, or an additional one shot may be used to drive the timing signal out low. The receiver must know that this last timing signal transition does not represent another data bit.

Figure 5:
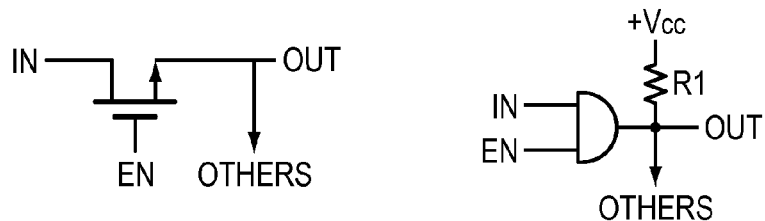
FIG. 5 is a schematic of two illustrative pass gates

FIG. 5 is a simple depiction of an N-type enhancement MOSFET that may be used as a pass gate. Pass gates are well known in the art, and P-type MOSFETS and combinations may be alternatively used. In some applications bipolar and hybrid type transistors may be used. Enablement of the pass gates will vary with the type of gate, and such is also well known in the art.

Another type of pass gate that may be used is the simple "and" gate where the outputs may be tied together. Typically this type of gate uses a resistor pull up, R1, that allows the other outputs to be tied together. In this design the interaction of R1 and the latches 24, 26 and 34, 36 must be configured to ensure proper operation.

Returning to FIG. 1, the reset of the registers F1-Fn, is shown using the set output (A) of the register, but the reset output (A-) may be used, and the NAND gate may be replaced as the designer might select with other logic gate types.

In FIG. 1, the delay circuits, DELAY 1-DELAYn, are illustratively a chain of current starved gates or inverter. Current starved inverters may be viewed as circuits demonstrating a given gain/bandwidth product. In such a design the gain forced high due to reduce current drive resulting in a low bandwidth circuit response. The result is that the circuit is slow. Designers skilled in the art can design well defined delays with such circuits. Other delay types may be used by those skilled in the art, for example, circuits with capacitances, counters, shift registers may be configured to produce delays.

An artifact of the present design is that the delays for each sequential bit are independent from each other, and those delays may be of different values. The flexibility of providing different timing for the various bits may be used to advantage in some applications.

It should be understood that above-described embodiments are being presented herein as examples and that many variations and alternatives thereof are possible. Accordingly, the present invention should be viewed broadly as being defined only as set forth in the hereinafter appended claims

What is claimed is:

1. A serializer comprising:
   a series of one shot circuits functionally connected so that each one shot triggers the succeeding one shot; each one shot defining an enable output,
   a first series of pass gates, each with an input coupled to a data bit, and each coupled to a first common output; and each of the first series of pass gates has an enable input coupled to a corresponding one shot output, wherein the data bit coupled to the pass gate input is transferred to the output when the enable is true;
   a second series of pass gates, each with an input tied to a logic level, and each coupled to a second common output; wherein the logic level input of each succeeding pass gate alternates between a logic high and a logic low, and each of the second series of pass gates has an enable input coupled to a corresponding one shot output, wherein the logic level coupled to the pass gate input is transferred to the output when the enable is true; and wherein when the first one shot is activated, a series of signal edges occur at the second common output and simultaneously a series of data bits are transferred to the first common output.

2. The serializer of claim 1 further comprising a first latch circuit on the first common output and a second latch circuit on the second common output.

3. The serializer of claim 1 wherein each one shot comprises a register and a delay circuit, wherein the register and the delay circuit are configures so that the delay circuit resets the register after the delay.

4. The serializer of claim 3 wherein the succeeding one shot is triggered at the end of the delay of the preceding one shot.

5. The serializer of claim 3 wherein each delay circuit provides a delay time that is independent from the other delay times of the other one shots.

6. The serializer of claim 1 further comprising:
   a strobe signal that initiates operation of the serializer.

7. The serializer of claim 1 wherein the first and second pass gates comprise pass logic gates.

8. The serializer of claim 1 wherein each of the first and second pass gates comprise a MOSFET transistor.

9. A method for serializing data bits comprising the steps of:
   creating a sequential time series of pulses, each succeeding pulse triggered from the preceding pulse;
   presenting an order set of data bits to the inputs of a first series of pass gates, each of the first series of pass gates having an enable input;
   coupling the outputs of the first series of pass gates to each other defining a common data output;
   coupling the time series of pulses to the enable inputs of each of the first series of pass gates; wherein each data bit coupled to the pass gate input is transferred to the first common output when the enable is true;
   coupling the inputs of a second series of pass gates to an alternating set of logic highs and lows,
   coupling the outputs of the second set of pass gates to each other defining a common timing signal output; wherein each of the second series of pass gates has an enable input;
   coupling the time series of pulses to the enable inputs of each of the second series of pass gates; wherein the alternating logic highs and lows provide a series of signal edge at the common timing signal output as the enables are true in sequence; wherein as sequence of pulses occur, a series of signal edges occur at the second common output and simultaneously a series of data bits are transferred to the first common output.

10. The method of claim 9 further comprising the step of latching the first and the second common outputs.

11. The method of claim 9 wherein the each pulse is created by the steps of:
   setting a register; and
   resetting the register by a delayed signal from the setting of the register.

12. The method of claim 11 further comprising the step triggering the setting of the next register at the end of the delayed signal.

13. The method of claim 11 wherein each of the delayed signals is independent from each other.

14. The method of claim 9 further comprising the step of initiating the operation of the serializer by a strobe signal.

* * * * *